US009726750B2

(12) United States Patent
Gross

(10) Patent No.: US 9,726,750 B2
(45) Date of Patent: Aug. 8, 2017

(54) METHOD AND APPARATUS FOR MULTI-MODE TRACKING AND DISPLAY OF PERSONNEL LOCATIONS IN A GRAPHICAL MODEL

(71) Applicant: Specialty Electrical, LLC, Fort Worth, TX (US)

(72) Inventor: Scotty Ray Gross, Fort Worth, TX (US)

(73) Assignee: Specialty Electrical, LLC, Fort Worth, TX (US)

( * ) Notice: Subject to any disclaimer, the term of this patent is extended or adjusted under 35 U.S.C. 154(b) by 870 days.

(21) Appl. No.: 13/975,946

(22) Filed: Aug. 26, 2013

(65) Prior Publication Data

US 2015/0057981 A1 Feb. 26, 2015

(51) Int. Cl.
| | | |
|---|---|---|
| *G06F 17/50* | (2006.01) | |
| *G01S 5/06* | (2006.01) | |
| *G01S 19/48* | (2010.01) | |
| *H04W 4/02* | (2009.01) | |
| *G07C 9/00* | (2006.01) | |

(52) U.S. Cl.
CPC ............... *G01S 5/06* (2013.01); *G01S 19/48* (2013.01); *G07C 9/00111* (2013.01)

(58) Field of Classification Search
CPC . G06F 17/50; G06F 17/5004; G08B 21/0269; H04W 4/02; G01S 5/0027; G07C 9/00111
USPC .......................................... 703/1; 340/539.13
See application file for complete search history.

(56) References Cited

U.S. PATENT DOCUMENTS

| | | |
|---|---|---|
| 5,006,983 A | 4/1991 | Wayne et al. |
| 6,393,410 B1 | 5/2002 | Thompson |
| 7,003,400 B2 | 2/2006 | Bryant |
| 7,062,514 B2 | 6/2006 | Harris |
| 7,529,650 B2 | 5/2009 | Wakelam et al. |
| 7,769,595 B2 | 8/2010 | Lopez et al. |
| 7,899,739 B2 | 3/2011 | Allin et al. |
| 8,015,113 B2 | 9/2011 | Petersen et al. |
| 8,041,650 B2 | 10/2011 | Gaffey et al. |
| 8,063,904 B2 | 11/2011 | Lynam |
| 8,099,312 B2 | 1/2012 | Jin et al. |
| 8,191,292 B2 | 6/2012 | Cummings et al. |
| 8,193,940 B2 | 6/2012 | Cummings et al. |

(Continued)

FOREIGN PATENT DOCUMENTS

| | | |
|---|---|---|
| WO | 2006013587 | 2/2006 |
| WO | 2011112572 | 9/2011 |

*Primary Examiner* — Omar Fernandez Rivas
*Assistant Examiner* — Shiuh-Huei Ku
(74) *Attorney, Agent, or Firm* — Schultz & Associates, P.C.

(57) ABSTRACT

The preferred embodiment provides an ultra-wide band radio frequency real-time location system (RTLS), synchronized with a GPS location system to provide reliable location data, in and around concrete and steel superstructures to a BIM graphic model system, to gather and display worker location data and coordinate its display for use. The RTLS system continuously locates each participant through the use of an active RFID tag and/or GPS location device, which may be placed in a personnel badge and verified. The location system logs the participant locations in a database for real-time information retrieval and upload into a BIM display system.

24 Claims, 13 Drawing Sheets

(56) References Cited

U.S. PATENT DOCUMENTS

| | | |
|---|---|---|
| 2002/0124028 A1 | 9/2002 | Kroeger |
| 2002/0165723 A1 | 11/2002 | Kroeger |
| 2002/0198755 A1 | 12/2002 | Birkner et al. |
| 2003/0013146 A1 | 1/2003 | Werb |
| 2003/0155413 A1 | 8/2003 | Kovesdi et al. |
| 2004/0117361 A1 | 6/2004 | Greer et al. |
| 2004/0186763 A1 | 9/2004 | Smith |
| 2005/0039115 A1 | 2/2005 | Gordon et al. |
| 2005/0171790 A1 | 8/2005 | Blackmon |
| 2005/0188299 A1 | 8/2005 | Furman et al. |
| 2005/0222923 A1 | 10/2005 | Lambright |
| 2005/0222942 A1 | 10/2005 | Pheil et al. |
| 2006/0015475 A1 | 1/2006 | Birkner et al. |
| 2006/0044307 A1 | 3/2006 | Song |
| 2006/0085322 A1 | 4/2006 | Crookshanks |
| 2006/0224398 A1 | 10/2006 | Lakshman et al. |
| 2007/0027732 A1 | 2/2007 | Hudgens |
| 2007/0112574 A1 | 5/2007 | Greene |
| 2008/0015823 A1 | 1/2008 | Arnold et al. |
| 2008/0133306 A1 | 6/2008 | Stirlen |
| 2008/0133307 A1 | 6/2008 | Creedle et al. |
| 2008/0195434 A1 | 8/2008 | Broughton |
| 2008/0306798 A1 | 12/2008 | Anke et al. |
| 2008/0312946 A1 | 12/2008 | Valentine et al. |
| 2009/0018882 A1 | 1/2009 | Burton et al. |
| 2010/0106654 A1 | 4/2010 | Simpson et al. |
| 2010/0174656 A1 | 7/2010 | Nolan |
| 2010/0198652 A1 | 8/2010 | Spanton, Jr. et al. |
| 2010/0332281 A1 | 12/2010 | Horvitz et al. |
| 2011/0035245 A1 | 2/2011 | Nielsen et al. |
| 2011/0125539 A1 | 5/2011 | Bollapragada et al. |
| 2011/0213631 A1 | 9/2011 | Mislavsky |
| 2011/0307281 A1 | 12/2011 | Creveling et al. |
| 2012/0066019 A1 | 3/2012 | Hinshaw et al. |
| 2013/0314210 A1* | 11/2013 | Schoner .......... G06K 7/10366 340/8.1 |

\* cited by examiner

METHOD AND APPARATUS FOR MULTI-MODE TRACKING AND DISPLAY OF PERSONNEL LOCATIONS IN A GRAPHICAL MODEL

FIELD OF THE INVENTION

The present invention relates to the building construction field. More specifically, the invention relates to integration of personnel tracking technologies into computer aided design software to identify the location and descriptions of construction workers.

BACKGROUND OF THE INVENTION

Participants in the construction industry are constantly challenged to deliver successful projects despite tight budgets, limited manpower, accelerated schedules, and limited or conflicting information. The significant disciplines such as architectural, structural and plumbing and electrical must be coordinated to ensure efficiency.

In the past, traditional building design was largely reliant upon two-dimensional drawings (plans, elevations, sections, etc.). However, modern building techniques include electronic building information modeling (BIM). BIM extends traditional building design beyond two dimensional drawings by providing electronic display of projects in three dimensions. BIM also covers spatial relationships between components and equipment installation, light analysis, geographic information, and quantities and properties of building components.

The BIM concept provides a virtual construction of a facility prior to its actual physical construction, in order to reduce uncertainty, improve safety, and increase efficiency between sub-contractors. Sub-contractors from various disciplines can input critical information into the electronic model before beginning construction, with opportunities to pre-fabricate or pre-assemble some systems off-site. Waste can be minimized on-site and products delivered on a "just-in-time" basis rather than being stock-piled on-site.

Quantities and shared properties of materials can be extracted easily. Project scope work can be isolated and defined. Systems, assemblies and sequences can be shown in a relative scale with the entire facility or group of facilities. BIM also prevents errors by enabling conflict or 'clash detection' whereby the computer model visually highlights to the team where parts of the building (e.g., structural frame and building services pipes or ducts) may wrongly intersect.

The BIM concept involves representing a design as combinations of "objects." The objects are typically undefined, generic or product-specific, solid shapes or void-space (like the shape of a room), that carry their geometry, relations and attributes. BIM design tools allow extraction of different views from a building model including objects for drawing production and other uses. These different views are automatically consistent, being based on a single definition of each object.

For the professionals involved in a construction project, BIM enables a virtual information model to be handed from the design team (architects, surveyors, civil, structural and building services engineers, etc.) to the main contractor and subcontractors and then on to the owner/operator; each professional adds discipline-specific data to the single shared model. This reduces information losses that traditionally occurred when a new team takes 'ownership' of the project, and provides more extensive information to owners of complex structures.

Use of the BIM concept extends beyond the planning, design and construction phases of a project, into the building life cycle, including uses in cost management, maintenance management, and facility operation.

Many software programs are available for implementing a BIM concept. For example, Revit is available from Autodesk of San Rafael, Calif. Revit products use ".RVT" files for storing BIM models. Typically, a building model is constructed using 3D wireframe objects to create walls, floors, roofs, structure, windows, doors ductwork, electrical systems and other objects as needed. These 3D objects are generally organized "families" and are saved in appropriate files in a database, and to be later imported into a graphics display routine.

A BIM "model" is typically a database file represented in the various ways which are useful for design work. Such representations can be plans, sections, elevations, legends, and schedules. Because changes to each representation of the database model are made to one central model, changes made in one representation of the model (for example, a plan) are propagated to other representations of the model (for example, elevations). Thus, drawings and schedules are always fully coordinated in terms of the building objects shown in drawings.

Revit is only one of many varieties of BIM software which support an open XML-based IFC standard. This file type makes it possible to standardize workflow from different discipline consultants of a building project.

Despite its advantages, the BIM concept of the prior art lacks the ability to track the real time location, expertise and other attributes of construction workers while they are on-site. "Collisions" of workers, including duplication of effort, attendance and allocation of resources are not integrated into the BIM concept. Applicant has recognized that a need exists to integrate worker tracking into the BIM concept to enable efficient allocation of various skill levels and disciplines of workers, and to identify and isolate problems such as choke points and excess labor force allocation.

Applicant has also realized that no one tracking technology provides the dependability required to efficiently and reliably track and identify construction workers in a "live" building construction project. For example, large moving steel equipment, concrete, construction barriers, walls and high current electric devices such as air handlers and generators present on a live construction site all interfere to some degree with different tracking technologies at different times leading to failure.

Despite their limitations, certain known technologies, when combined in a way described by Applicant, provide a novel solution to the problems of tracking and monitoring workers in a live construction project.

One generally reliable tracking technology is a radio-frequency identification system ("RFID"). The RFID system uses electronic tags attached to the objects to be identified.

The RFID tag stores information electronically in a non-volatile memory. The RFID tag includes a small RF transmitter and receiver. An RFID reader transmits an encoded radio signal to interrogate the tag. The tag receives the message and responds with its identification information. The response generally includes a unique tag serial number, and product-related information such as a stock number, lot or batch number, production date, or other specific information. RFID tags usually contain an integrated circuit for storing and processing information, modulating and demodulating a radio-frequency (RF) signal, collecting DC power from the incident reader signal, and other specialized functions and an antenna for receiving and transmitting radio frequency signals.

Another known technology utilized by Applicant is the Global Positioning System or GPS. GPS provides location and time information in all weather conditions, anywhere on or near the Earth where there is an unobstructed line of sight to four or more GPS satellites. The system provides critical capabilities to military, civil and commercial users around the world. It is maintained by the United States government and is freely accessible to anyone with a GPS receiver.

GPS receivers may include an input for differential corrections, using the RTCM SC-104 format. This is typically in the form of an RS-232 port at 4,800 bit/s speed. Data is actually sent at a much lower rate, which limits the accuracy of the signal. Receivers with internal DGPS receivers can outperform those using external RTCM data.

Many GPS receivers can relay position data using the NMEA 0183 protocol. Although this protocol is officially defined by the National Marine Electronics Association (NMEA), references to this protocol have been compiled from public records, allowing open source tools like "gpsd" to read the protocol. Proprietary protocols also exist, such as the SiRF and MTK protocols. Receivers can interface with other devices using methods including a serial connection, USB, or Bluetooth.

Civilian GPS devices provide latitude and longitude information, but, are not considered sufficiently accurate or continuously available enough (due to the possibility of signal blockage and other factors) to rely on exclusively to transmit highly accurate location information over a wide range of building construction equipment due primarily to interference from concrete and steel structures.

The prior art has attempted several piecemeal solutions using either RFID or GPS, but none have attempted to combine positioning systems with a BIM model or other 3-D construction modeling systems and none have been completely satisfactory.

For example, a known method for attaching an RFID tag to a worker is U.S. Pat. No. 8,191,292 to Cummings, et al. and U.S. Pat. No. 8,193,940 to Cummings, et al. Cummings, et al. disclose a device for displaying a recognition award includes a hard hat and an RFID tag located in a detachable holder on the hard hat. The device is used to provide a hands free way to position an RFID tag at an easily recognizable location on the construction worker. But, Cummings, et al. do not disclose a way to integrate the RFID tag with a BIM model.

International Patent Publication No. WO 2006/013587 to Di Floriano describes a system including a plurality of sensors in a targeted area tracking a plurality of people carrying RFID devices. Di Floriano lacks the means or necessary systems to precisely track location, having only the ability to ascertain if a person carrying an RFID device is inside the targeted area.

U.S. Patent Publication No. 2003/0013146 to Werb discloses a real-time locating system using a hybrid tag device having a dedicated location position system transmitter and a beacon transmitter. However, Werb does not disclose a way to input location information into a BIM system or to compensate for problems caused by obstructions on a construction site which interfere with the locating system.

U.S. Patent Publication No. 2008/0312946 to Valentine, et al. proposes location based services including real-time tracking and information management for trade show events. Valentine, et al. do not describe a system for initiating tracking information with a construction BIM or a redundant position system which compensates for obstructions.

U.S. Patent Publication No. 2008/0195434 to Broughton discloses a system for managing construction information based on a graphic model. Parameters such as installation status, cost status, and delivery times are associated in a database with a component in the graphical model. RFID tags are used to analyze the location of the object and its status as "installed" or "uninstalled." However, Broughton does not disclose a way to integrate location information of personnel or construction workers into a BIM model nor does it provide a way to track or avoid constantly moving items (like workers) and compensate for building construction obstructions.

Various embodiments disclosed address the need for worker location system for building construction projects which allows integration of personnel location information from synchronized RFID and GPS location systems and a coordinated upload of location information into a BIM format for display. Other disclosed embodiments provide synchronizing of location information to greatly improve the reliability of GPS information with RFID information.

SUMMARY OF INVENTION

The preferred embodiment provides an ultra-wide band radio frequency real-time location system (RTLS), synchronized with a GPS location system to provide reliable location data, in and around concrete and steel superstructures to a BIM graphic model system, to gather and display worker location data and coordinate its display for use.

The RTLS system continuously locates each participant through the use of an active RFID tag and/or a GPS location device, which may be placed in a personnel badge and verified. The location system logs the participant locations in a database for real-time retrieval and upload into a BIM display system.

BRIEF DESCRIPTION OF THE DRAWINGS

In the detailed description of the preferred embodiments, reference is made to the accompanying drawings.

DETAILED DESCRIPTION

Figure 1:
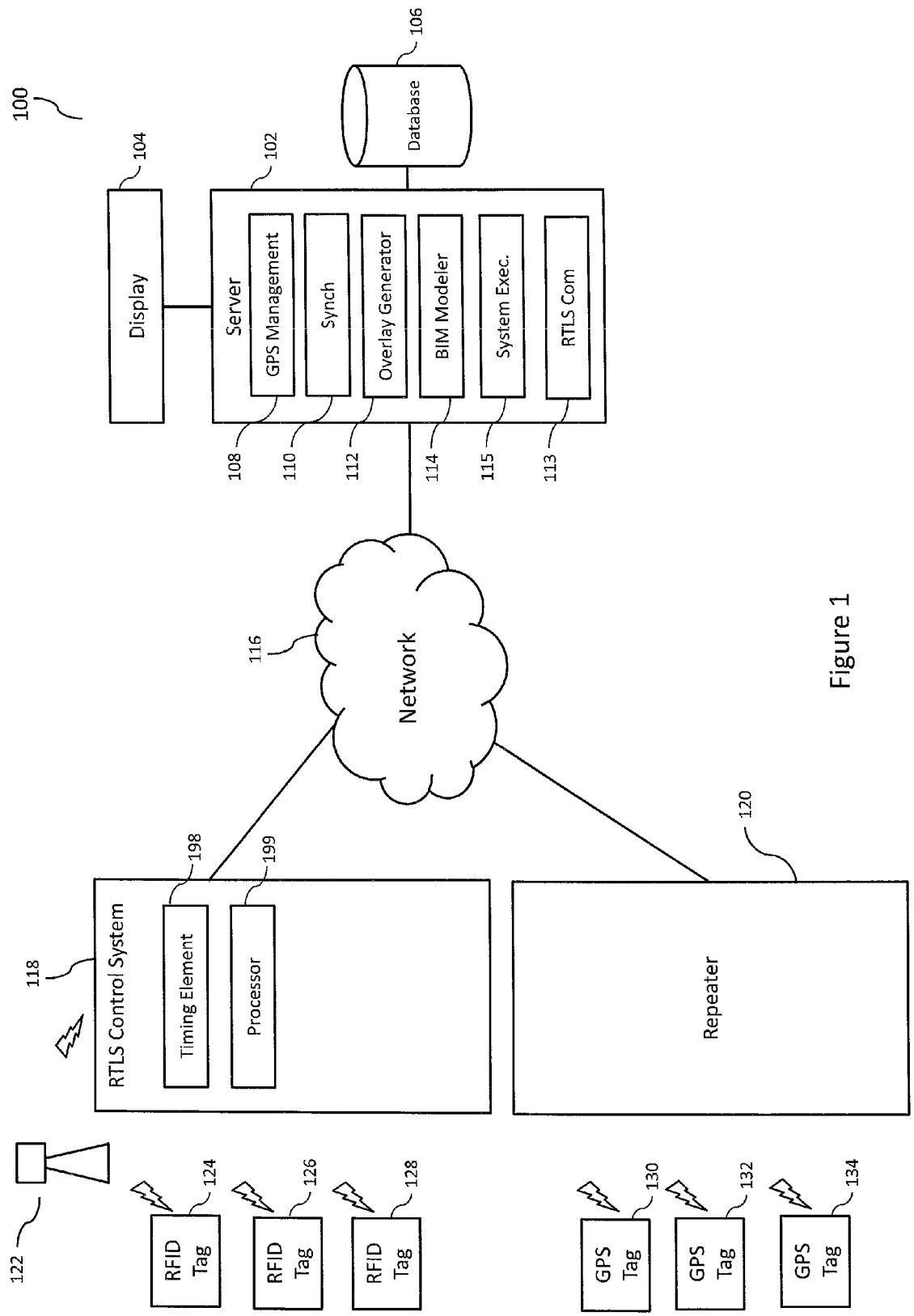
FIG. 1 is a block diagram of the preferred embodiment of the system disclosed.

It will be appreciated by those skilled in the art that aspects of the present disclosure may be illustrated and described herein in any of a number of patentable classes or context including any new and useful process, machine, manufacture, or composition of matter, or any new and useful improvement thereof. Therefore, aspects of the present disclosure may be implemented entirely in hardware, entirely in software (including firmware, resident software, micro-code, etc.) or combining software and hardware implementation that may all generally be referred to herein as a "circuit," "module," "component," or "system." Further, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. For example, a computer readable storage medium may be, but not limited to, an electronic, magnetic, optical, electromagnetic, or semiconductor system, apparatus, or device, or any suitable combination of the foregoing. More specific examples of the computer readable storage medium would include, but are not limited to: a portable computer diskette, a hard disk, a random access memory ("RAM"), a read-only memory ("ROM"), an erasable programmable read-only memory ("EPROM" or Flash memory), an appropriate optical fiber with a repeater, a portable compact disc read-only memory ("CD-ROM"), an optical storage device, a magnetic storage device, or any suitable combination of the foregoing. Thus, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. The propagated data signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, or any suitable combination thereof.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages.

Aspects of the present disclosure are described with reference to flowchart illustrations and/or block diagrams of methods, systems and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

Referring to FIG. 1, system 100 includes server 102. In a preferred embodiment, is a UNIX system operated on a modern server hardware platform including at least one processor, and a random access memory with at least one local storage drive organized to contain various data structures.

The server is connected to display 104 and database 106. The server includes several software modules. GPS management module 108 resides in memory and is responsible for collecting GPS position data from a number of GPS tags, to be later described.

The server includes synchronization routine 110, which resides in memory, and is responsible for synchronizing location information from the RTLS control system and the GPS tags, as will be further described later.

The server includes overlay generator 112, which resides in memory. The overlay generator is responsible for converting tabular location information into a graphics file, compatible with the BIM modeler to be displayed in real-time in association with the BIM construction model.

The server includes BIM modeler 114, which resides in memory. The BIM modeler is a graphics display routine which displays various graphics files or "overlays" in a construction model, such as a .CSV file. In a preferred embodiment, the BIM modeler uses Revit System, available from Autodesk, as previously described.

System executable file 115 activates and coordinates the function of the various modules of the system and is responsible for execution of the various methods of system set up and installation.

RTLS com 113 is a module responsible for communications and upload of data from the RTLS control system.

In a preferred embodiment, the server is connected to network 116, which is in turn connected to RTLS control system 118 and cellular repeater 120. In one preferred embodiment, the network is the internet. In another preferred embodiment, network 116 can be an intranet such as an Ethernet connection which connects the repeater, the RTLS control system and the server.

In a preferred embodiment, the RTLS control system includes central timing element 198 that synchronizes each sensor one to another. The RTLS control system, which also includes a central processor, is connected to the network. The RTLS system can provide simply proximity information based on the position of the RFID tag relative to the sensor position. In a preferred embodiment, the closest sensor is reported as the RFID tag location. The RTLS system also may be programmed to triangulate positions of the RFID tags, and thereby report a more accurate location of the RFID tag as a combination of signals from different sensors. The sensors, being synchronized, are capable of detecting pulses and measuring time difference of arrival (TDoA) of RFID tag. Processor 199 may also be programmed to utilize the TDoA data to compute velocity vectors and to compute quality of detected positions.

A suitable RTLS system for the preferred embodiment is the Series 7000 RTLS platform from Ubisense, Ltd. which employs UWB RF tags capable of sustaining a continuous 160 Hz update rate, so that a RFID tag location can be provided every 6.25 ms from each sensor and cell area. The Ubisense system utilizes a 2.4 GHz ISM band wireless network to accomplish communications between the RFID tags and the system. Other RTLS systems that provide proximity notification will also suffice.

The system further includes sensor node array 122. Sensor node array 122 consists of a series of interconnected sensor cells, as will be further described. The system includes a set of RFID tags, such as RFID tags 124, 126 and 128. In a preferred embodiment, the RFID tags are pulsed source tags available from Ubisense, Ltd. in conjunction with the series 7000 RTLS platform. The RFID tags generate a continuous stream of UWB RF pulses for ranging. The RFID tag devices in combination with a separate wireless network are capable of encoding information bits that are passed to the RTLS system.

The system includes Cellular repeater 120. Cellular repeater 120 is a compact 3G indoor wireless access point which provides cellular service inside concrete and steel structures such as buildings. The cellular repeater is designed to assure continuous coverage regardless of proximity and connections to other macro networks.

The system includes a set of GPS tags, such as GPS tags 130, 132 and 134. GPS tags communicate through cellular repeater 120 to network 116 to transmit coordinate locations. In a preferred embodiment, each GPS tag is the Simvalley GT-280 GPS Tracker, available from Simvalley Mobile of Campbell, Calif.

Figure 2A:
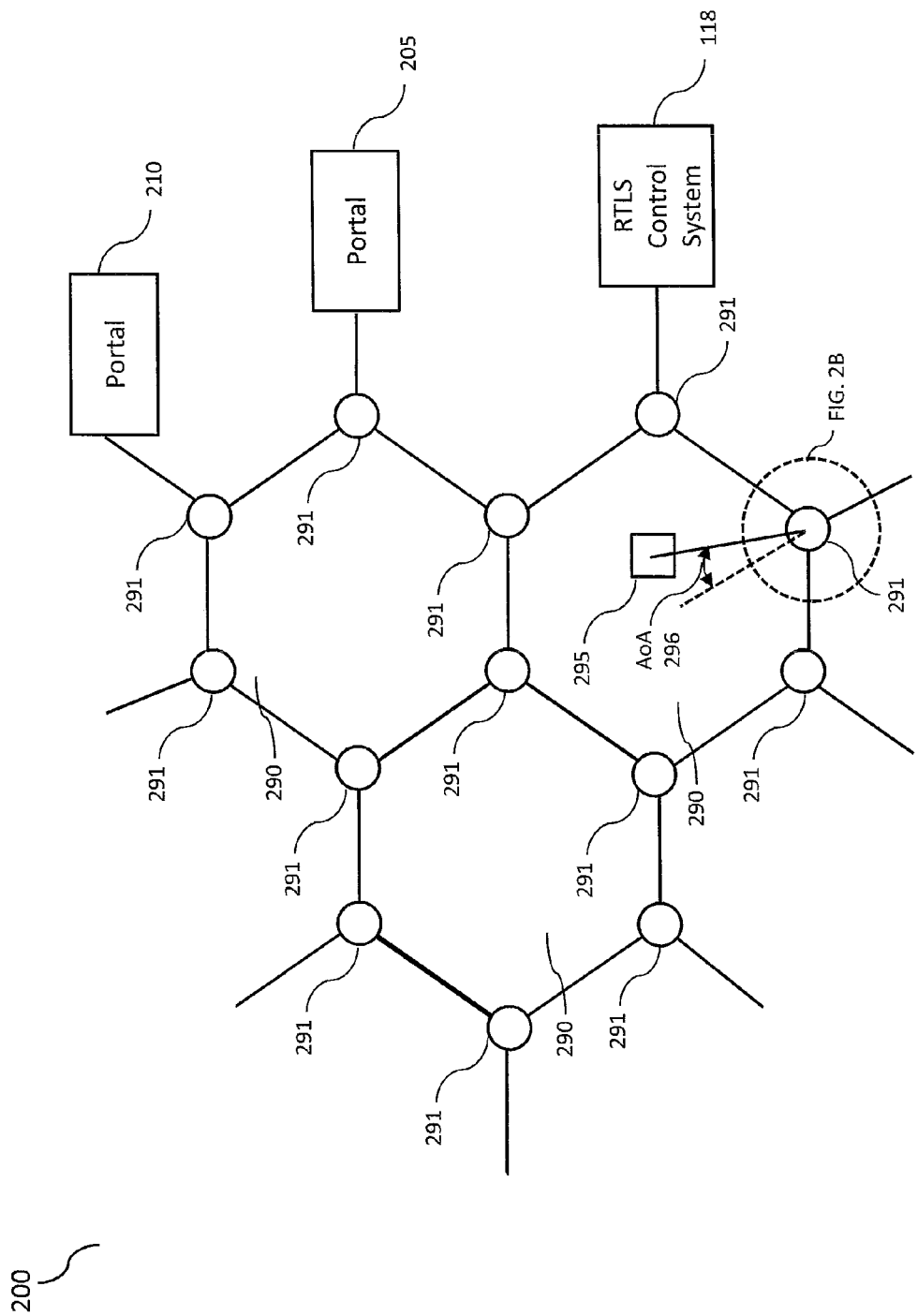
FIG. 2A is a depiction of cell areas defined by a set of sensor nodes of a preferred embodiment of the system.

Referring to FIG. 2A, in the preferred embodiment, a depiction of cell areas 200 is shown. The sensors are arranged in a set of sensor cells 290 made up of interconnected compound sensor nodes 291. The sensor nodes are connected to RTLS control system 118.

While the sensor nodes may be configured in an infinite number of geometrical configurations, the preferred embodiment is to place the sensor nodes such as to form hexagonal shaped sensor cells. The hexagonal shape is advantageous because it capitalizes on the beam pattern of known antennas to maximize power usage and to eliminate both the presence of deadspots and increase the efficiency of cell-to-cell hand-off for positional and velocity determination near cell borders. Other shapes, such as square or perpendicular polygons are also possible. Further, three dimensional arrangements are possible for construction projects with multiple levels. The typical physical size of sensor cells are approximately 90 feet in diameter and the typical positional resolution of the Ubisense based RTLS is 15 cm in three dimensions.

Figure 2B:
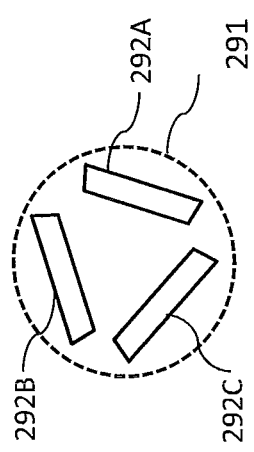
FIG. 2B is a block diagram of a sensor node of a preferred embodiment.

Referring to FIG. 2B, each sensor node in the set of sensor nodes 291 contains a plurality of sensors capable of sensing information transmitted from pulsed signal sources and the directionality of pulsed signals generated from the pulsed signal sources. Each sensor node 291 contains an array of sensors 292A, 292B, and 292C. In a preferred embodiment, these sensors are positioned at 120° angles to each other in each sensor node. In other embodiments, each sensor node can incorporate a different number of sensors, from 1 to 10, depending on the radiation pattern emitted. Sensors can be paired at different angles.

RFID tag 295 emits UWB RF pulses which are detected by sensor node 291 among other sensor nodes. In the preferred embodiment, ultra wide band (UWB) radio frequency (RF) pulses are utilized for the RFID tag signals. Other embodiments may use different types of signals such as ultrasound or RF signals such as those used by cellular networks. The sensors are capable of detecting the angle of arrival (AoA) of UWB RF pulses generated from the UWB pulsed sources. Each sensor is capable of measuring the angle of arrival, AoA 296, of the signal from the RFID tag. In other embodiments, the sensors can be set to run in "proximity mode," indicating only if an RFID tag is present or not.

The sensor array also includes dedicated sensor "portals," such as portals 205 and 210. The portals are generally positioned at fixed locations on the construction site, away from the sensor array, such as doors, gates and construction elevators. In a preferred embodiment, each portal includes a MOD3 reader cabinet which includes both a reader emit and mounted in a weather proof cabinet, available from Industrial Portals, a Jamison Door Company of Hagerstown, Md.

Figure 3:
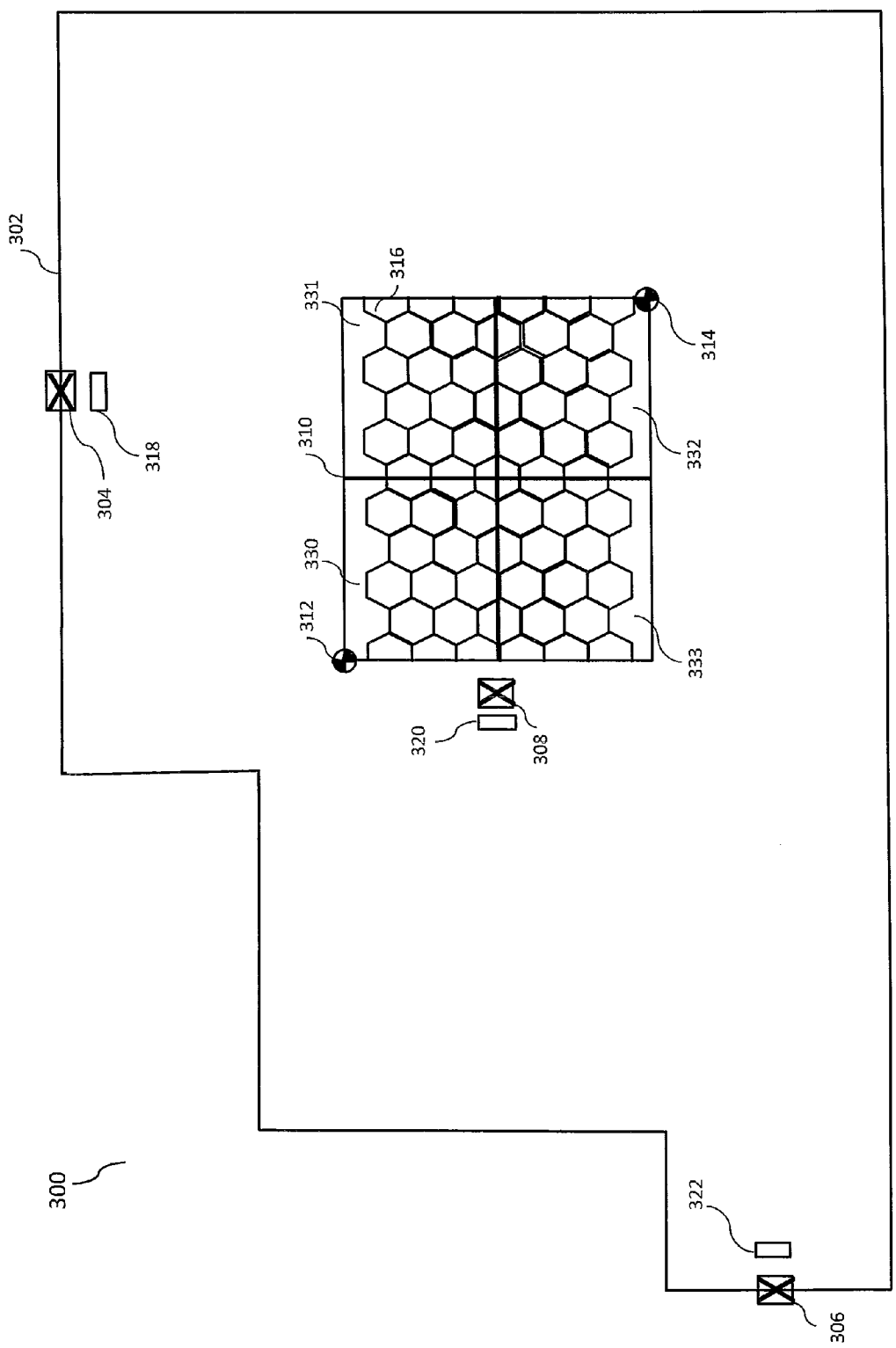
FIG. 3 shows an exemplary deployment of disclosed system.

Referring to FIG. 3, an exemplary deployment of the system at a construction site is described. Exemplary construction site 300 includes a perimeter 302, usually fenced. The perimeter has entry/exit gates 304 and 306 at which portals 322 and 318 are located. The construction site includes an elevator 308 at which portal 320 is located. A building 310 is located within the perimeter. The building can include several floors, or levels. Each level of the building includes a set of site survey control points 312 and 314. A "honey comb" RTLS deployment is shown at 316. Sensors are located at the corner of each honeycomb cell. Each level, or floor, of building 310 includes a separate RTLS deployment. A series of four quadrilateral "zones" are shown as defined in the BIM model at 330, 331, 332, and 333.

Each construction site is different and typically requires a different number of workers, a different building configuration and a different perimeter. Each system will have common elements, but the number and configuration of those elements typically changes for each construction project.

Figure 4:
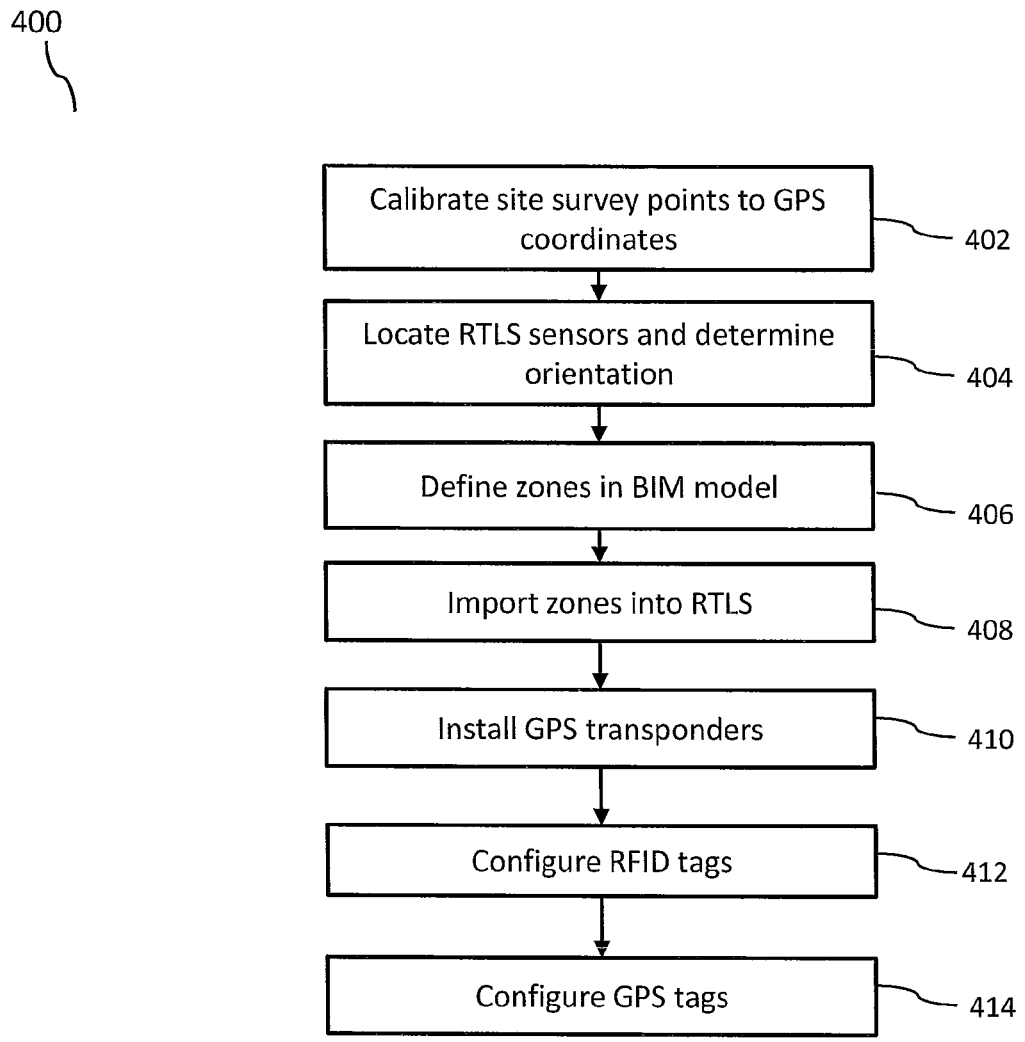
FIG. 4 is a flow chart of a process of deployment of a preferred embodiment of the system disclosed.

Referring to FIG. 4, process 400 of deployment of the system is described. At step 402, site survey points are calibrated to GPS coordinates, for this way, the BIM model is accurately calibrated to provide "real-world" coordinates. In a preferred embodiment, the GPS location of each site survey point is located with a hand-held GPS locator. At step 404, the RTLS sensors are installed at the building facility and calibrated. Calibration of the RTLS systems requires locating each sensor in a defined three dimensional space and determining its exact location and orientation in space (its roll, pitch and yaw).

At step 406, "zones" are determined in the BIM model. "Zones" are predefined areas within the building construction project. The zones are independent of the RTLS sensor locations. At step 408, the zones are imported into the RTLS system. During import, an offset is acquired from the calibrated site survey points. The offset orients relative three-dimensional information related to the site survey points into absolute GPS compatible positions.

At step 410, the required GPS transponders are installed at the construction site. At step 412, the RFID tags are configured. At step 414, the GPS tags are configured.

The BIM zone object is a complex object having various display parameters. In a preferred embodiment, the parameters include relative GPS coordinates that define a three-dimensional area of space at the construction site. A color hue parameter is also provided. This parameter includes a table of colors to indicate different information. In a preferred embodiment, the information includes number of workers, area of expertise and a percentage job completion. Other parameters may be specified in the table. In the preferred embodiment, a color density, opacity or intensity may also be employed to indicate numerical values.

Figure 5:
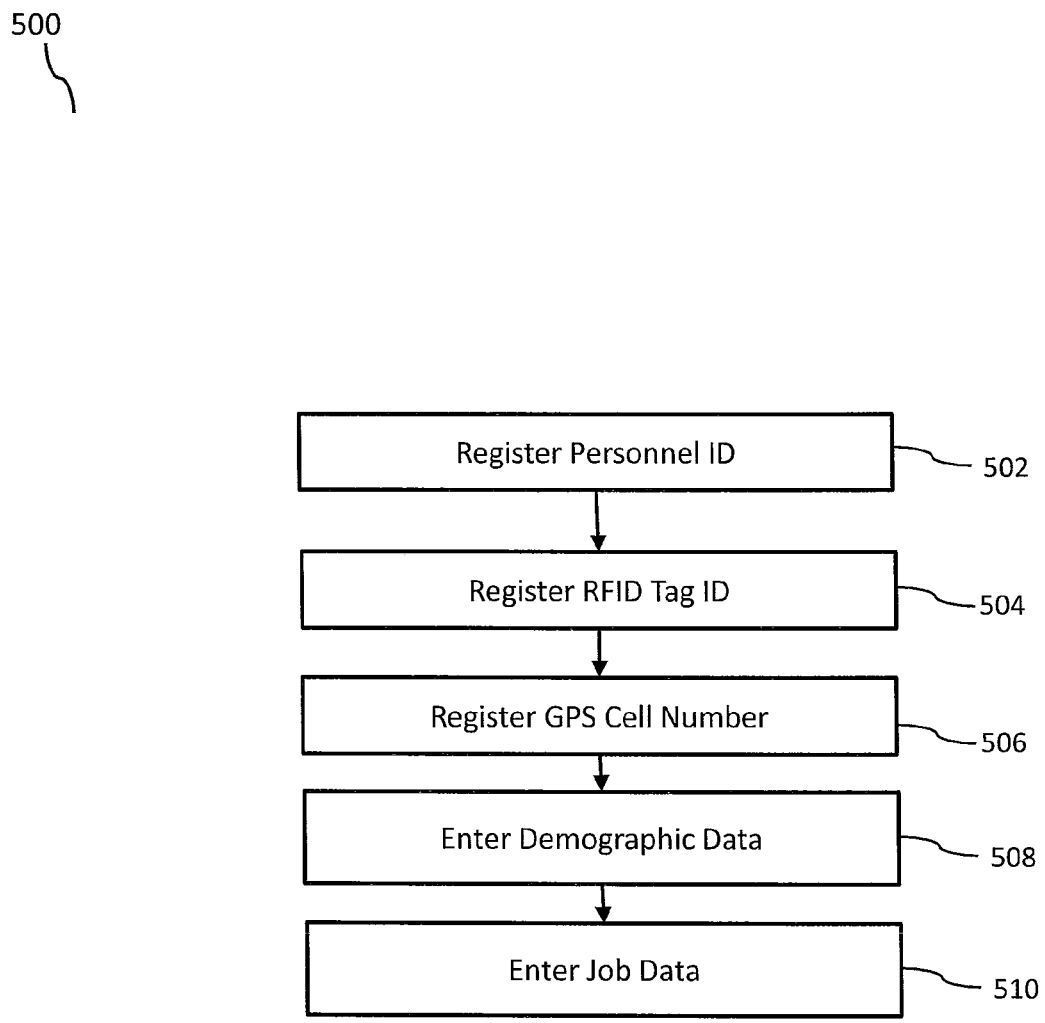
FIG. 5 shows a flow chart of a process of tag set up of a preferred embodiment of the system disclosed.

Referring to FIG. 5, process 500 of RFID tag and GPS tag configuration will be discussed. At step 502, the server registers a unique personnel id for each person to be tracked with the system. At step 504, each person is assigned a unique RFID tag. At step 506, each person is assigned a specific GPS cell number. Each person may be associated with a single RFID tag, a single GPS cell number, or both. This is important on construction sites where one type of tag is not functional throughout the entire site due to "dead spots" or obstructions, moving or fixed.

At step 508, the server receives demographic data about the person, such as name, field of expertise and authorization level for various zones.

At step 510, the server receives construction job data which identifies the job location, BIM map information, and other information, such as insurance status, pay scale status, contract status, and work zone completion benchmarks.

Figure 6:
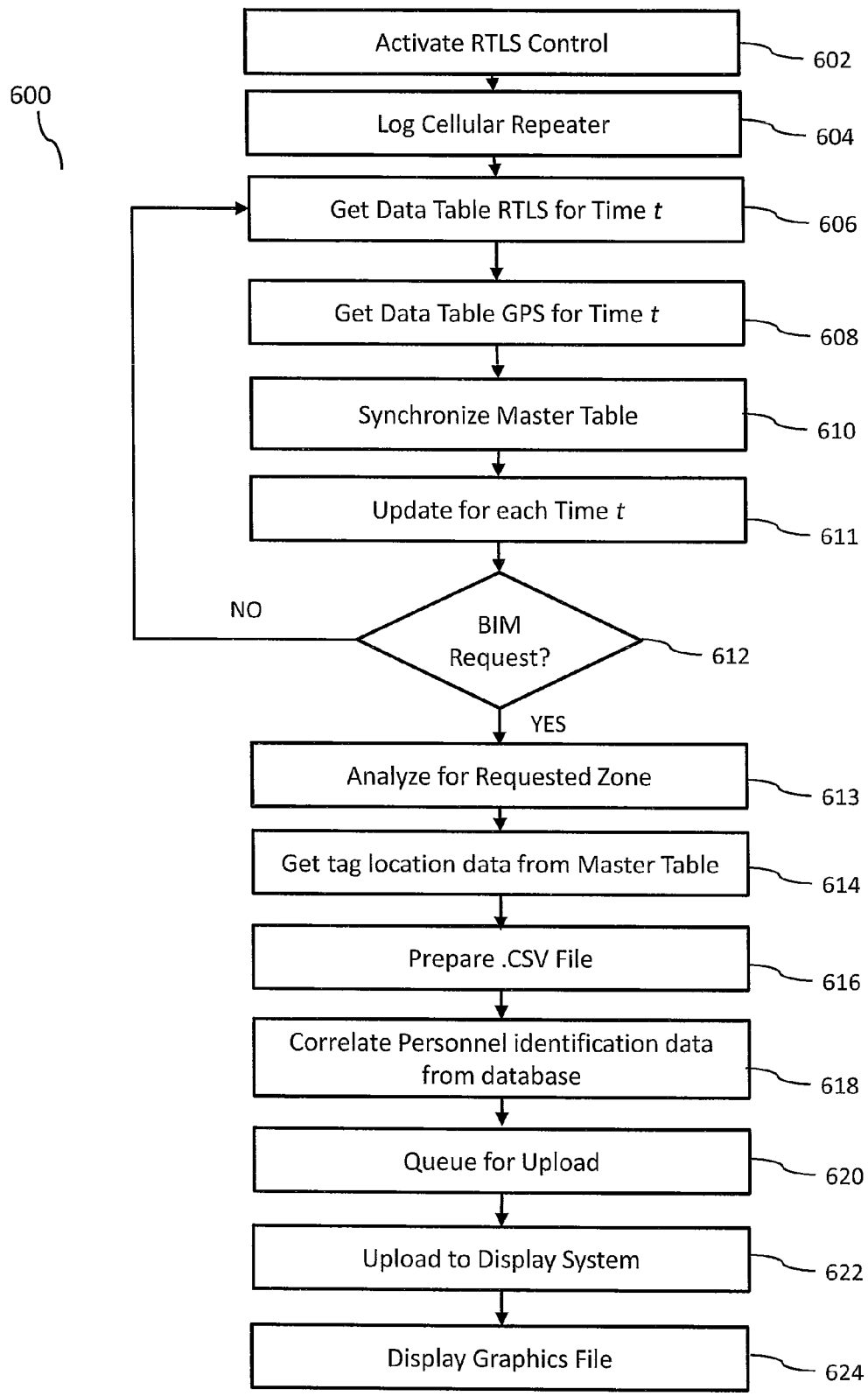
FIG. 6 is a flow chart of the steps of use of a preferred embodiment.

Referring to FIG. 6, use of system 600 will be described. At step 602, the RTLS control system is activated and begins collected data from the RTLS tags and storing it in an RTLS data table. The data table is continuously updated with new RTLS tag locations. At step 604, the system executable file pings cellular repeater 120 to make sure it is active. At step 606, the system executable file uploads the RTLS data table from the RTLS control system for a predetermined time period $t_1$. At step 608, the system executable file communicates with the GPS management module to upload the GPS data table for predetermined time period $t_1$.

At step 610, the server synchronizes the RTLS data table and the GPS data table into a master data table, to be further described.

At step 611, the processor updates the master data table with location data for each time period t. At step 612, the system executable file constantly monitors the BIM model module for requests for information. If not received, the process returns to step 606. If a BIM model request is received, the process proceeds to step 613.

At step 613, the BIM request is analyzed for requested zones. At step 614, the process queries the master data table to obtain which tags are located in the requested zone. At step 616, a .CSV file is prepared. Preparation of the .CSV file includes the novel comparison of various numerical values to a color hue density table to arrive at "translucency" parameters which provide data to color each particular requested zone with a particular translucent color, to be displayed by the BIM modeler, as will be further described.

At step 618, database 106 is queried to correlate personnel identification data with the location data from the master table. In a preferred embodiment, the personnel identification data is tabulated for display by the BIM modeler.

At step 620, the .CSV file and correlated personnel identification data are queued for upload to the BIM modeler. At step 622, the .CSV and correlated personnel identification data file is uploaded to the BIM display system. At step 624, the BIM modeler displays the graphics file including the graphics overlay, to be further described.

Figure 7:
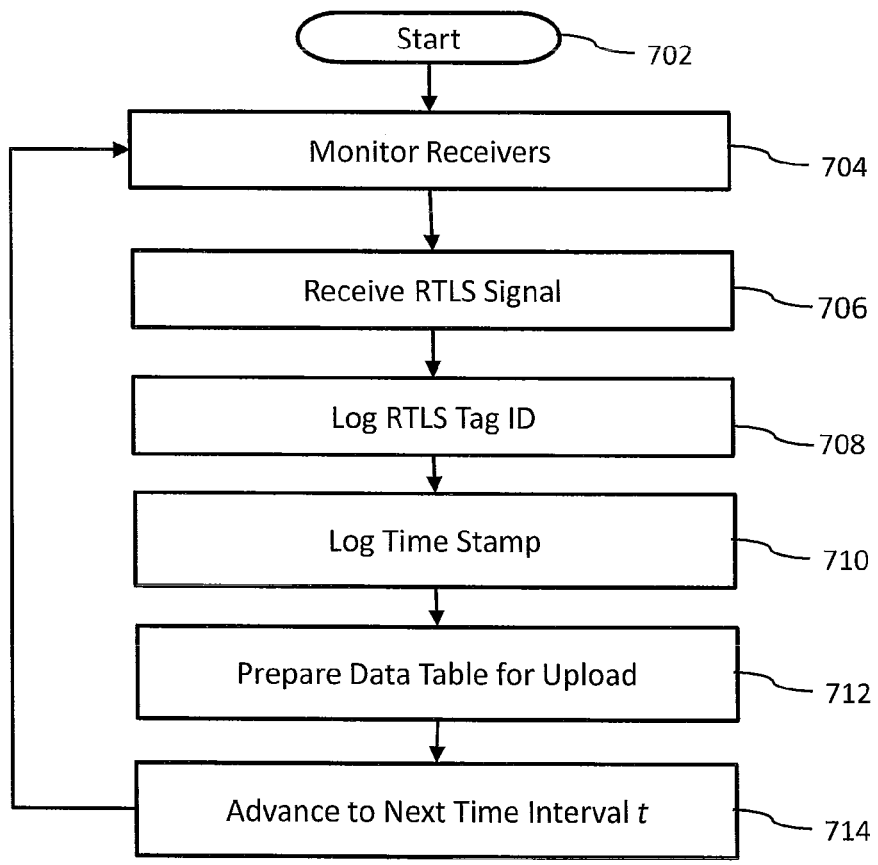
FIG. 7 is a flow chart of the process carried out by the RTLS control system of a preferred embodiment.

Referring to FIG. 7, process 700 carried out by the RTLS control system 118 will be further described. At step 702, the RTLS control system receives a start command from the server. At step 704, the RTLS control system begins to monitor the sensor nodes to receive signals from each of the RTLS tags. In a preferred embodiment, the signals include proximity signals, AoA signals and $t_{dist}$ signals. At step 706, the RTLS signals are received. At step 708, each RFID tag ID is logged along with location according to a predetermined number of zones. At step 710, the location information is correlated with a time stamp or a predetermined time interval $t_1$.

At step 712, the RTLS control system prepares the data table for upload, which includes the RFID tag ID, location and time stamp. An event notification can be sent to the server of movement of one or more of the RTLS tags.

At step 714, the RTLS control system advances to the next time interval t and returns to step 704.

Figure 8:
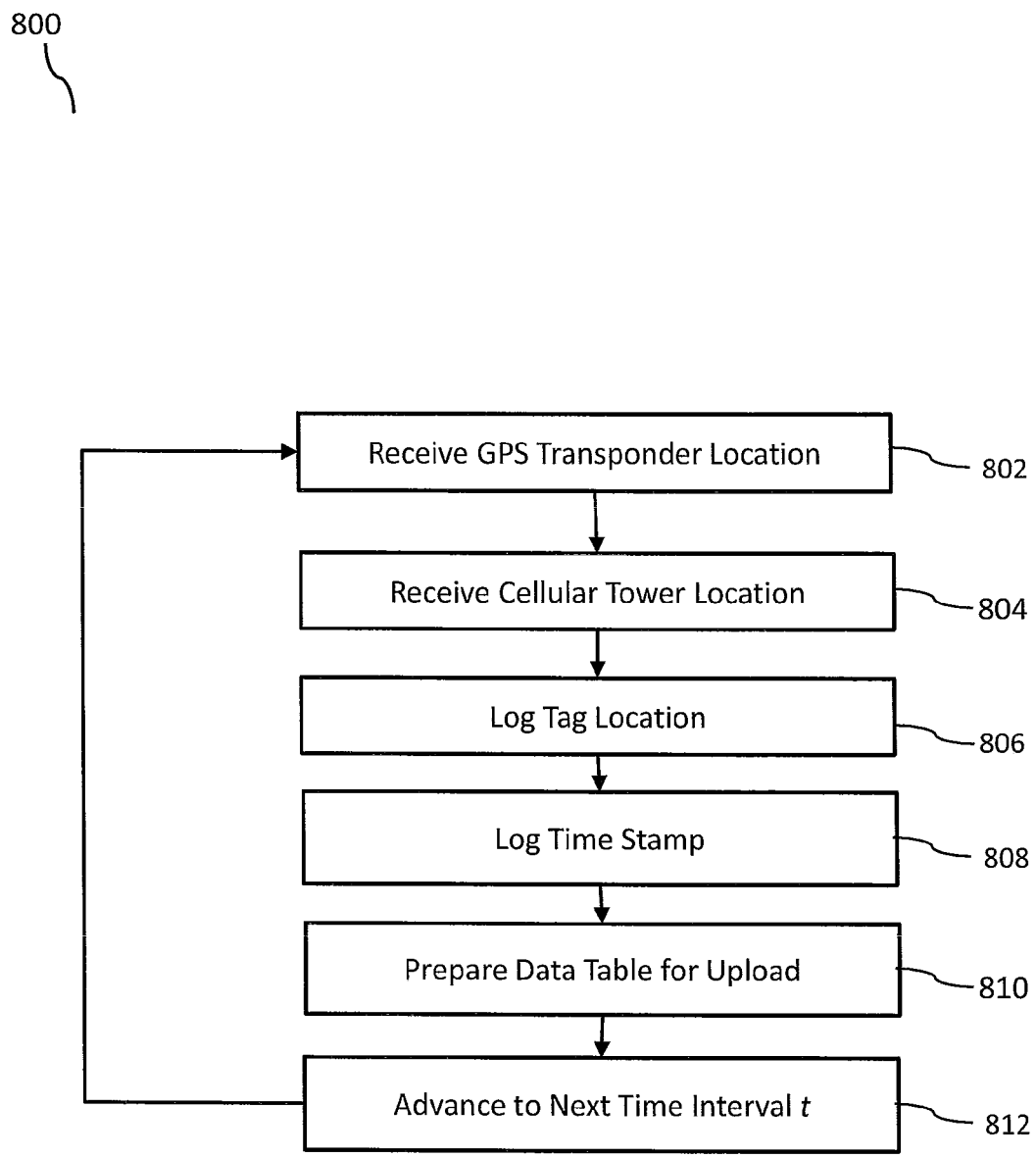
FIG. 8 is a flow chart of the functions of a GPS module of the preferred embodiment.

Referring to FIG. 8, functions 800 of GPS management module 108 will be described. At step 802, the GPS management module receives GPS transponder information from each GPS tag via cellular repeater 120. In an alternate preferred embodiment, each GPS tag communicates with a local cellular tower which is provided to GPS management module 108 through network 116. At step 804, the GPS management module receives GPS tag location from the cellular tower. At step 806, the GPS management module logs the longitude and latitude received from the GPS tag. At step 808, the time stamp or predetermined time period $t_1$ is associated with the tag location and GPS tag ID. In the preferred embodiment, the GPS tag ID is the cellular phone number associated with the GPS tag.

At step 810, the GPS management module prepares a data table for upload the system executable file 115. At step 812, the GPS management module advances to the next time interval t and returns to step 802.

Figure 9:
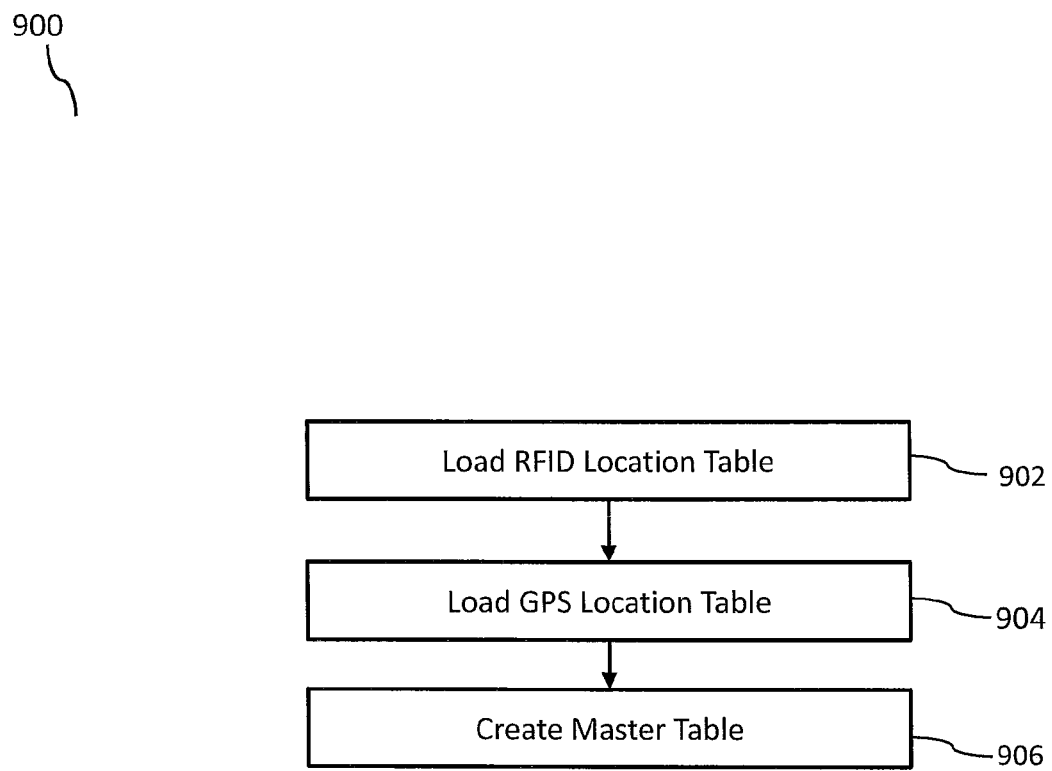
FIG. 9 is a flow chart of a synchronization method of a preferred embodiment of the system.

Referring to FIG. 9, the synchronization method 900 of the master table accomplished by synchronization module 110 will be further described.

At step 902, the synch module uploads the RFID location table. At step 904, the module uploads the GPS location table. At step 906, the synchronization module creates a master table based on tag ID. As shown below in Table 1, for each personnel ID there may be an associating RFID tag number and/or GPS tag number. If both an RFID and GPS tag number are included, the synchronization module will upload two separate tables whose data may or may not agree as to tag location, for each time interval. In order to eliminate conflicting data, synchronization module compares and examines the GPS location data against the tag location data.

A table showing an example of the data as read and the synchronization determined by the method 1000 is below:

TABLE 1

| Time  | GPS Location | Tag Location | Synch Location |
|-------|--------------|--------------|----------------|
| $t_1$ | 1            | 1            | 1              |
| $t_2$ | 1            | 1            | 1              |
| $t_3$ | 2            | 1            | 2              |
| $t_4$ | 2            | 2            | 2              |
| $t_5$ | 2            | 3            | 3              |
| $t_6$ | 3            | 3            | 3              |

Figure 10:
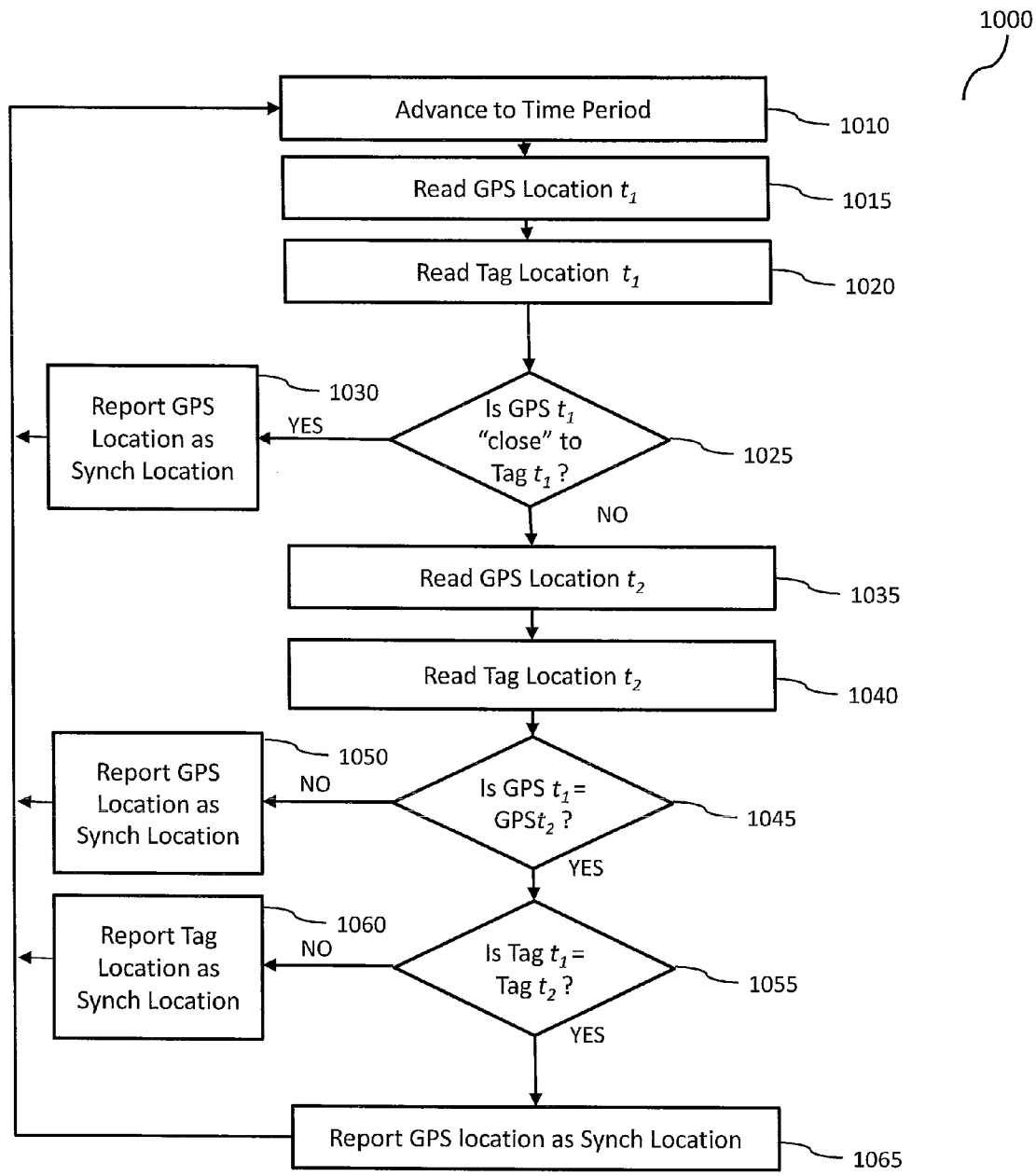
FIG. 10 is a flow chart of the preferred embodiment of method of eliminating conflicting data and synchronization mismatches.

Referring then to FIG. 10, method 1000 of eliminating conflicting data and synchronization mismatches will be described.

At step 1010, the processor advances to a time period. At step 1015, the processor reads the GPS tag location at time period $t_1$. At step 1020, the processor reads the tag location at time period $t_1$. At step 1025, the processor compares the GPS tag location at time period $t_1$ to the tag location at time period $t_1$. If the two are "close," then the processor moves to step 1030 where it reports the GPS location as the synch location. "Close" is a Boolean function that returns "true" if the two positions are within a predetermined distance. The processor then returns to step 1010. If the GPS tag location at time period $t_1$ is not equal to time period $t_1$, then the processor moves to step 1035. At step 1035, the processor reads the GPS location at the next increment of time $t_2$. At step 1040, the processor reads the tag location at the next increment of time $t_2$. At step 1045, the processor compares the GPS tag location at time $t_1$ to the GPS tag location at $t_1$. If the two are not equal, the processor then proceeds to step 1050. At step 1050, the processor report the GPS tag location as the synch location. If the two are not equal, the processor proceeds to step 1055. At step 1055, the processor compares the tag location and time $t_1$ to the tag location and time $t_2$. If the two are not equal, the processor then proceeds to step 1060. At step 1060, the processor reports the tag location and time $t_2$ as the synch location. The processor then returns to the step 1010. If the tag location and time $t_1$ are equal to the tag location and time $t_2$, then the processor reports the GPS location at time $t_2$ as the synch location and returns to step 1010.

The method applied by the synchronization modules results in the fastest and most reliable zone identification as between the two competing GPS and RFID systems.

Figure 11:
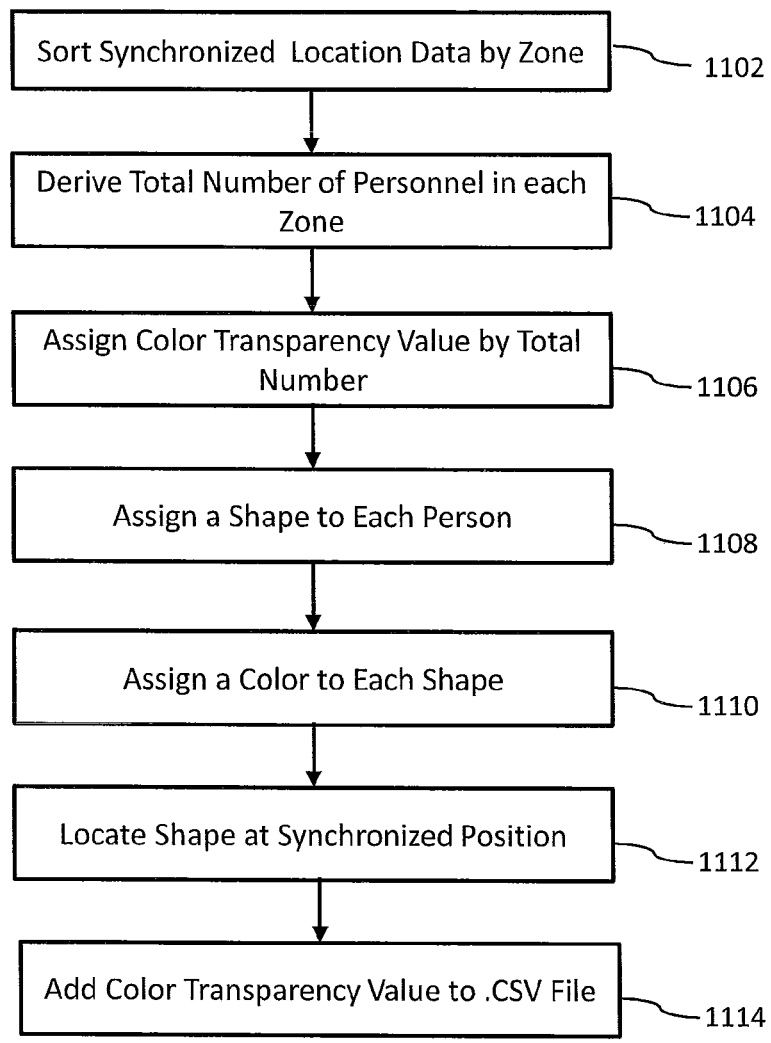
FIG. 11 is a flow chart of a preferred embodiment of deriving a color transparency value.

Referring to FIG. 11, a flow chart 1100 of a preferred embodiment of deriving a color transparency value will be described. At step 1102, the processors sort the synchronized location data by geographic zone, allocating the location of each of the personnel for the predetermined time period into a specific zone, at a predetermined time period.

At step 1104, the processor counts total number of personnel for each zone. At step 1106, a color transparency value is assigned according to a range of total number of personnel in each zone. In a preferred embodiment, lesser numbers of total personnel are assigned a higher transparency value. Likewise, higher numbers of total personnel in each zone are assigned a lower transparency value. Colors with high transparency values appear nearly transparent for each zone. Colors with low transparency values appear more opaque in each zone. Varying transparency provides a novel visual abstraction for each zone indicating "at a glance" the general number of personnel in each zone for any given time period.

In other preferred embodiments, the visual abstraction can include a colored geometric representation of each person, located in a zone for the predetermined time period.

At step 1108, the processor assigns a geometric shape to each person, such as a sphere or a cube. The shape is scaled so as to be large enough to be recognized in BIM model.

At step 1110, a color is assigned to each person depending on chosen demographic criteria, such as profession. At step 1112, the shape is located at the synchronized position for each person.

At step 1114, the color transparency values are imported into the .CSV file, to be used by the BIM modeler in each zone, for each time period.

Figure 12:
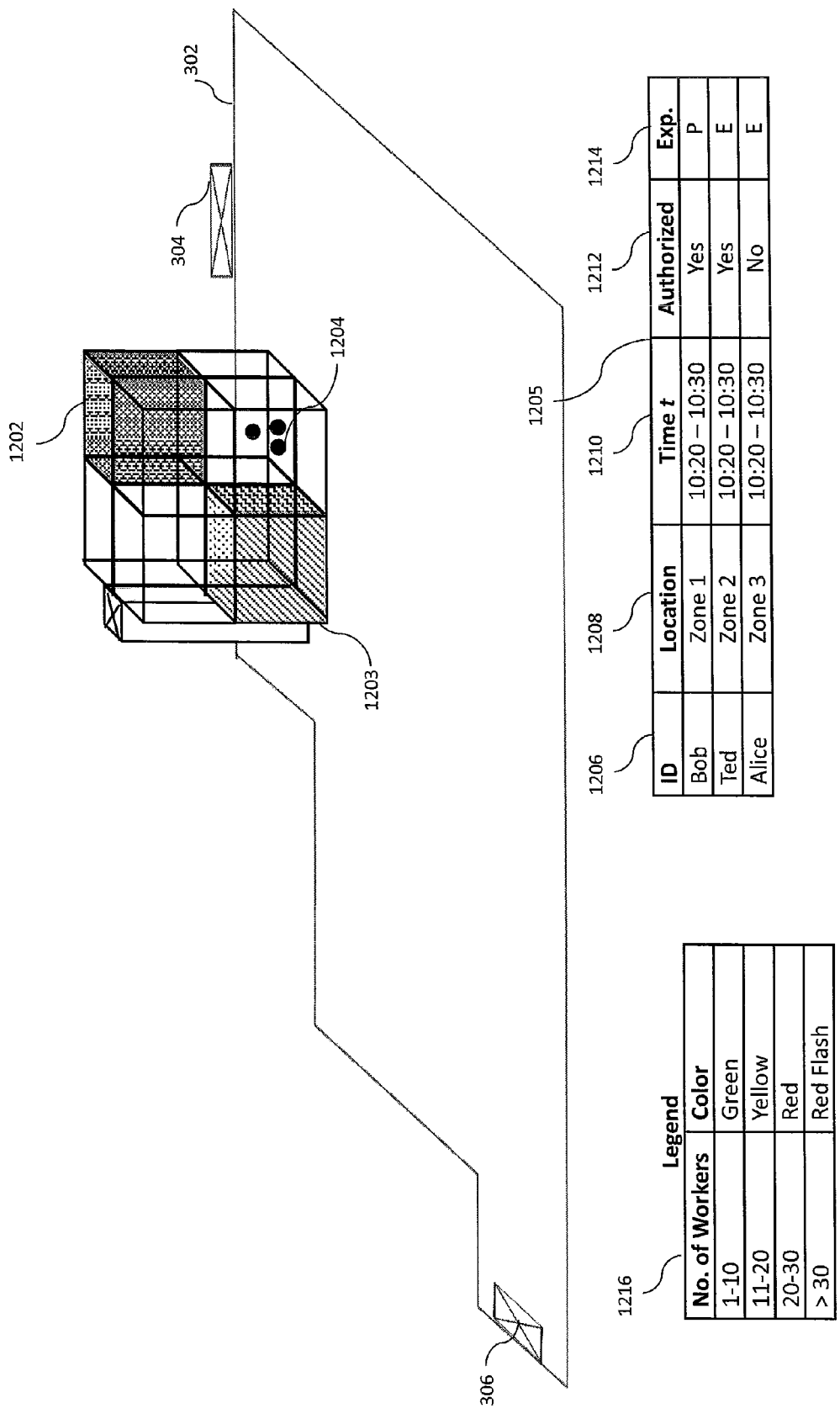
FIG. 12 is a graphic representation of display generated by the BIM modeler of a preferred embodiment.

Referring to FIG. 12, a display generated by the BIM modeler will be described. The BIM modeler displays a wire frame model of building 310, in three-dimensions. The overlay shades zones 1202 and 1203, according to the transparency value, if personnel are present in those zones during the predetermined time period. In a preferred embodiment, the zones are color coordinated for easy visual identification. Geometric representations of personnel for the predetermined time period are shown at 1204.

A master data table 1205 is displayed on the screen, which indicates personnel ID 1206, personnel location 1208, time period 1210, whether or not the personnel is authorized to be in the zone 1212, and the expertise of the personnel 1214. In this example, a plumber is shown as a "P," an electrician is shown "E". The data table may be sorted according to any column for ease of data interpretation. Legend data table 1216 is displayed on the screen which, in this example, shows a range of number of workers in the sensor zones. The master data file and/or the shaded zones form a visual abstraction of data relevant and timely to the BIM model. Of course, other information can be displayed in the legend data table.

In an arcuate embodiment, the display generated by the BIM modeler includes a display and a series of overlays made in time order for a progressive series of time periods. The progressive display of overlays creates a "movie-like" presentation of the visual abstractions of the personnel data. For example, color transparency may vary from light to dark over time. Similarly, geometric representations of personnel will change in location.

Although various embodiments have been described in detail, those skilled in the art will understand that changes, substitutions and alterations can be made without departing from the spirit and scope of what has been described. Accordingly, all such changes, substitutions and alterations are intended to be included as defined in the following claims.

The invention claimed is:

1. A system for tracking and displaying personnel location related to a building model comprising:
   a computer having a processor designated to carry out a computer implemented method comprising the steps of:
   receiving a first type of location data for the personnel;
   receiving a second type of location data for the personnel;
   deriving a synchronized position from the first type of location data and the second type of location data;
   deriving a visual abstraction related to the synchronized position;
   displaying the visual abstraction in the building model as a wire frame model in three dimensions;

calibrating a set of site survey points of a level of a building that corresponds to the building model to respective GPS coordinates located using a GPS locator;
receiving a set of demographic data related to the personnel;
counting a total number of personnel in each zone associated with the building model; and,
displaying the set of demographic data that includes, a name, a field of expertise, and an authorization level as a table.

2. The system of claim 1 wherein the visual abstraction includes a building information modeling (BIM) model overlay.

3. The system of claim 1 wherein the processor is further designated to carry out the steps of:
correlating the synchronized position with a zone; and displaying the visual abstraction in the zone.

4. The system of claim 1 wherein the processor is further designated to carry out the step of displaying a location summary for a predetermined time period.

5. The system of claim 1 further comprising a real-time location system (RTLS system) in communication with the processor and wherein the processor is further programmed to carry out the steps of:
gathering the first set of location data from a set of RFID tags in the RTLS system.

6. The system of claim 1 further comprising a GPS system in communication with the processor and wherein the processor is further programmed to carry out the step of:
gathering the second set of location data from a set of GPS tags in the GPS system.

7. The system of claim 1 wherein the processor is further programmed to carry out the steps of:
assigning a predetermined time period to the first type of location data and the second type of location data.

8. A system for tracking and displaying personnel location in a graphical building model comprising:
a computer having a processor designated to carry out a computer implemented method comprising the steps of:
receiving a set of demographic data related to the personnel;
receiving a set of personnel location data for a predetermined period of time;
assigning the set of personnel location data to a zone;
correlating the set of demographic data with the set of personnel location data;
deriving a visual abstraction related to the set of demographic data, the personnel location data, and the zone;
displaying the visual abstraction in the graphical building model as a wire frame model in three dimensions;
calibrating a set of site survey points of a level of a building that corresponds to the graphical building model to respective GPS coordinates located using a GPS locator;
counting a total number of personnel in each zone associated with the graphical building model; and,
displaying the set of demographic data that includes, a name, a field of expertise, and an authorization level as a table.

9. The system of claim 8 wherein the graphical building model is a building information modeling (BIM) model.

10. The system of claim 8 wherein the visual abstraction includes a subset of demographic data from the set of demographic data.

11. The system of claim 8 wherein the processor is designated to carry out the step of correlating the graphical building model to a known GPS coordinate system.

12. The system of claim 8 wherein the processor is further designated to carry out displaying the zone in a building information modeling (BIM) model overlay.

13. The system of claim 8 wherein the processor is further designated to carry out the step of assigning a time stamp to a subset of personnel location data in the set of personnel location data.

14. A method of tracking personnel at a construction site and displaying a location in a graphical model comprising the steps of:
receiving a set of location data related to a set of personnel;
correlating the set of location data to a predetermined time period;
correlating the set of location data to a set of demographic data related to the personnel;
deriving a visual abstraction of the location data related to the construction site;
displaying the visual abstraction in the graphical model as a wire frame model in three dimensions;
calibrating a set of site survey points of a level of a building that corresponds to the graphical model to respective GPS coordinates located using a GPS locator;
receiving the set of demographic data related to the personnel;
counting a total number of personnel in each zone associated with the building model; and
displaying the set of demographic data that includes, a name, a field of expertise, and an authorization level as a table.

15. The method of claim 14 wherein the step of displaying the visual abstraction further comprises the step of shading a zone related to the construction site.

16. The method of claim 14 wherein the step of displaying the visual abstraction further comprises the step of displaying an area of expertise.

17. The method of claim 14 wherein the step of deriving the visual abstraction further comprises relating the location data to a geographic shape.

18. The method of claim 14 wherein the step of receiving a set of location data further comprises receiving the set of location data for a set of predetermined time periods.

19. The method of claim 14 wherein the step of receiving the set of location data further comprises:
receiving a first type of geographic location data;
receiving a second type of geographic location data; and,
synchronizing the first type of geographic location data and the second type of geographic.

20. The method of claim 14 wherein the step of deriving a visual abstraction further comprises relating the visual abstraction to a number of personnel in a zone.

21. The system of claim 3:
wherein the computer implemented method further comprises:
assigning a color transparency value to each zone according to a range of the total number of personnel in each zone;
including the color transparency of each zone in the display of the building model;

displaying a first data table comprising a first column, a second column, and a number of rows;

displaying a second data table comprising a first column, a second column, a third column, a fourth column, a fifth column, and a number of rows;

wherein a zone with a lesser total number of personnel is assigned a color of higher transparency value than a zone with higher total number of personnel;

wherein for the first data table:
the first column of the first data table includes a range of a total number of personnel for a row of the first data table;
the second column of the first data table includes a color associated with the range of a total number of personnel from the first column of the first data table;

wherein for the second data table:
the first column of the second data table includes a name of a person associated with a row of the second data table;
the second column of the second data table identifies a location of the person associated with the row of the second data table;
the third column of the second data table includes a time associated with the row of the second data table;
the fourth column of the second data table includes an indication of whether the person associated with the row is authorized to be in the location identified in the second column of the row of the second data table; and,
the fifth column of the second data table identifies an expertise of the person associated with the row of the second data table.

22. The system of claim 1 wherein the processor is further designated to carry out the steps of:
calibrating a set of sensor nodes installed at the building that corresponds to the building model by locating each sensor node in a defined three dimensional space and determining a location and orientation including roll, pitch, and yaw for each sensor node;
determining a set of zones in the building model that are predefined areas of a building construction project related to the building model and that are independent of the locations of the sensor nodes; and,
acquiring an offset for each of the calibrated site survey points to import the set of zones, wherein each offset orients relative three-dimensional information related to a site survey point to the GPS coordinates.

23. The system of claim 1, further comprising:
a real time location system (RTLS) deployed on each level of the building associated with the building model, each RTLS comprising:
a set of sensor nodes arranged in a set of hexagonal shaped sensor cells;
each sensor cell about 90 feet in diameter and a typical positional resolution of about 15 centimeters (cm) in three dimensions;
each sensor node in the set of sensor nodes containing an array of sensors capable of sensing information transmitted from pulsed signal sources and capable of sensing a directionality of pulsed signals generated from the pulsed signal sources;
the sensors positioned at generally 120° angles to each other in each sensor node;
the system deployed at a construction site that includes a perimeter;
the perimeter further comprising one or more of the group of an entry gate and an exit gate that respectively comprise a first portal and a second portal;
wherein the construction site includes an elevator with a third portal;
the construction site comprising the building that is located within the perimeter and that is associated with the building model;
the building comprising one or more of levels;
each level of the building comprising a set of site survey control points; and,
a series of four quadrilateral zones that are defined in the building model.

24. The system of claim 1, wherein the step of deriving a synchronized position from the first type of location data and the second type of location data further comprises:
receiving first location data of the first type of location for the personnel at a first time;
receiving second location data of the second type of location data for the personnel at the first time;
when the first location data is close to the second location data, reporting the first location data of the first type of location data as the synchronized position;
when the first location data is not within a predetermined distance of the second location data:
receiving third location data of the first type of location for the personnel at a second time;
receiving fourth location data of the second type of location for the personnel at the second time;
when the first location data is not substantially equal to the third location data, reporting the third location data of the first type of location data as the synchronized position;
when the first location data is substantially equal to the third location data and the second location data is not substantially equal to the fourth location data, reporting the fourth location data of the second type of location data as the synchronized position; and,
when the first location data is substantially equal to the third location data and the second location data is substantially equal to the fourth location data, reporting the third location data of the first type of location data as the synchronized position.

* * * * *